United States Patent [19]

Sommer

[11] Patent Number: 4,673,827
[45] Date of Patent: Jun. 16, 1987

[54] PROXIMITY SWITCH INSENSITIVE TO INTERFERENCE FIELDS

[75] Inventor: Gerhard Sommer, Kohlberg, Fed. Rep. of Germany

[73] Assignee: Gebhard Balluff Fabrik Feinmechanischer Erzenguisse GmbH & Co., Neuhausen, Fed. Rep. of Germany

[21] Appl. No.: 787,450

[22] Filed: Oct. 15, 1985

[30] Foreign Application Priority Data

Oct. 18, 1984 [DE] Fed. Rep. of Germany ....... 3438120

[51] Int. Cl.$^4$ ........................................... H01H 36/00
[52] U.S. Cl. ..................................... 307/116; 361/179
[58] Field of Search ................... 307/116, 117; 328/5, 328/127; 335/38, 41, 205, 206, 207; 361/179; 362/802

[56] References Cited

U.S. PATENT DOCUMENTS

| | | | |
|---|---|---|---|
| 3,953,770 | 4/1976 | Hayashi | 361/179 |
| 4,161,659 | 7/1979 | Jacob | 335/207 X |
| 4,271,763 | 6/1981 | Berger | 335/207 X |
| 4,349,814 | 9/1982 | Akehurst | 335/206 X |
| 4,414,541 | 11/1983 | Ho | 307/117 X |
| 4,513,257 | 4/1985 | Miyamoto et al. | 331/65 |

FOREIGN PATENT DOCUMENTS

| | | |
|---|---|---|
| 1463397 | 10/1964 | Fed. Rep. of Germany . |
| 1463394 | 10/1964 | Fed. Rep. of Germany . |
| 0224738 | 7/1985 | German Democratic Rep. ................................. 361/179 |

Primary Examiner—William M. Shoop, Jr.
Assistant Examiner—Bentsu Ro
Attorney, Agent, or Firm—Leydig, Voit & Mayer

[57] ABSTRACT

A proximity switch comprises two magnetic field sensors for detecting an approach of a machine having a magnet. The two sensors are arranged in such a way that one of the sensors is at a smaller distance from the machine than the other sensor when the machine is in a detectable distance so that each of the two sensors responds to the approach of the magnetic field of the machine and outputs a detected signal based on the electrical output characteristics of the sensor. The detected signals from both sensors are fed to a differential circuit for generating a differential signal. In order to compensate interference field, the differential signal due to the magnetic field of the machine is set greater than the differential signal generated from the interference field. A circuit for converting the differential signal into an output signal is provided for the proximity switch.

11 Claims, 6 Drawing Figures

PROXIMITY SWITCH INSENSITIVE TO INTERFERENCE FIELDS

The invention relates to a proximity switch for detecting the position of a machine element, comprising at least one sensor responsive to the approach of the machine element and varying its electrical output characteristics accordingly, the sensor being affected by electrical and/or magnetic disturbances causing stray fields, and comprising a circuit associated with the sensor for converting the varying electrical output characteristics of the sensor into output signals for the proximity switch.

Proximity switches can be used for a multitude of purposes, including cases where interference fields occur in the region of the proximity switch and cause faulty output signals to be generated. This is the case, for example, when proximity switches are used to indicate the position of pistons in pneumatic cylinders utilized in welding tongs or robots. Due to the fact that the current supply cables for the electrical welding tongs pass close to the pneumatic cylinders and also due to a welding plasma, strong magnetic fields occur and these fields are still so strong in the region of the proximity switch that they generate faulty output signals in conventional proximity switches which simulate the presence (or absence) of a machine element.

In previously known proximity switches of the type described at the outset, the sensor is partially shielded and, at the same time, a delay circuit is provided to prevent any repetitive switching operations or chattering of the proximity switch. These measures are not, however, sufficient and so the switch still passes into an actuated state when a predetermined field intensity of the magnetic interference field is exceeded. For this reason, an additional locking module is provided. This stores the switching state prior to welding in the switch and inactivates the entire switch during welding so that faulty output signals are avoided. The disadvantage of this feature is, however, the fact that during welding no changes in the position of the piston in the pneumatic cylinder may be detected and signalled to the control means. As a result, the control means lose the information concerning the position of the piston in certain modes of operation and must first detect the position of the piston again, e.g. by moving the piston into its initial position, prior to additional control procedures.

The object underlying the invention is therefore to improve a proximity switch of the type in question such that its functioning is not affected by electrical and magnetic interference fields and so no faulty output signals may be generated due to these interference fields.

This object is accomplished in accordance with the invention, for a proximity switch of the type described at the outset, in that two sensors are arranged in spaced relation to one another and connected with a differential circuit generating a differential signal from the respective electrical output characteristics of the sensors, that one of these sensors is at a smaller distance from the machine element than the other sensor when the machine element is in its position to be detected and that the two sensors are so arranged relative to the machine element and have such a distance between them that the differential signal caused by the machine element in its position to be detected is greater than the differential signal generated due to the interference fields.

The advantage of the inventive proximity switch is to be seen in the fact that magnetic and/or electrical disturbances caused by interference fields may be compensated by generation of a differential signal and so the interference fields which affect both sensors in the same way are eliminated. The proximity switch therefore functions with the same reliability in the presence as well as in the absence of these interference fields. This eliminates all the abovementioned disadvantages of previous proximity switches. For example, pneumatic cylinders can be controlled and the position of the pistons in the pneumatic cylinders simultaneously detected via the inventive proximity switches during continuous welding processes without these proximity switches generating faulty output signals.

The machine element generates a considerably greater signal in the sensor located closer to it than in the sensor located farther away and therefore the influence of the machine element decreases in a gradient over the distance between the two sensors. A further, considerable advantage of the inventive proximity switch is then the fact that both spatially constant interference fields and interference fields having a spatial gradient can be compensated as long as the differential signal caused by the machine element is greater than the differential signal caused by the interference field. This is significant for practical use of such proximity switches since, for example, a current-carrying cable generates a magnetic field with a strength which has a gradient responsive to the distance of the magnetic field from the cable. However, even when the cable passes very close to a proximity switch, this does not cause the proximity switch to generate interference signals as long as the differential signal thus generated is smaller than the differential signal caused by the machine element.

If, however, the electronic circuit processing the signals generated by the sensors is to be kept as simple as possible, which is of great importance with a view to producing cheap embodiments of the proximity switch, solutions of this type provide that the two sensors are so arranged relative to the machine element and have such a distance between them that the differential signal caused by the machine element in its position to be detected exceeds the differential signal generated due to the interference fields at least approximately by a factor of 10. If this is the case, the fact that the machine element is in its position to be detected can be indicated in a simple manner when a signal exceeds or falls below a predetermined level, caused by the machine element reaching its position to be detected, since any inaccuracy possibly caused by interference fields having a spatial gradient is not in this case of significance because it is reduced by a factor of 10. It should be observed, however, that it is possible for interference fields having substantially larger gradients to be detected by the inventive proximity switch if greater inaccuracies in switching, i.e. detection of the machine element in its position to be detected, are accepted or if the electronic circuit processing the differential signals is more expensive and complicated in design and can ascertain much smaller differences between the differential signal caused by the machine element and the differential signal generated due to the interference fields.

In the embodiments of the proximity switches so far described, it has not been established how the sensors interact with the machine element. This can be done in the most varied ways. In one embodiment, it is favourable for the sensors to be designed as magnetic field sensors responsive to a magnet provided on the machine element. This means they can replace all previous proximity switches responsive to magnetic fields. This is, for example, the case when proximity switches are used on pneumatic cylinders for detecting the position of the pistons since these pistons usually have, as a standard feature, small magnets which for their part affect proximity switches mounted on the exteriors of the pneumatic cylinders and so enable the positions of the pistons in the cylinders to be detected.

A more reliable and improved switching behaviour of the proximity switch is achieved, above all in cases where the pattern of the magnetic field lines is known in the position of the machine element to be detected, when the magnetic field sensors each have a preferred direction of sensitivity to magnetic fields and are aligned such that their preferred directions of sensitivity extend parallel to a magnetic field to be detected. Such an arrangement of the magnetic field sensors not only intensifies the differential signal caused by the machine element but also generally leads to the differential signal caused by a field gradient of the interference field being suppressed in relation to the differential signal caused by the machine element.

In a very simple and reliable embodiment of the inventive proximity switch, the magnetic field sensors consist of a material which alters its electrical resistance in response to the external magnetic field. In this case, the sensors may be influenced only by magnetic fields and so only magnetic interference fields can cause a differential signal to be generated.

In another embodiment of a magneto-sensitive proximity switch, the sensors are Hall sensors. In this case, not only are magnetic fields to be taken into consideration as interference fields but also electrical fields which can have an effect on the Hall signal generated.

In a particularly preferred embodiment of the magneto-sensitive proximity switch, an amplifier is associated with the magnetic field sensors and located in their immediate vicinity. This amplifier converts high-impedance signals into low-impedance signals which are then fed to the differential circuit. This measure leads to a considerable reduction in the susceptibility of the circuit to disturbances due to electromagnetic stray effects since only the high-impedance portion of the circuit is sensitive in this respect.

As shown by the above remarks, the magneto-sensitive proximity switches are only one particular form of the inventive proximity switch. In a further variation of the inventive proximity switch, the sensors are coils of oscillatory circuits of oscillators which are dampable each time a metal machine element approaches the coils. These proximity switches do not require the machine element itself to generate a field which may be detected by the sensor but react quite generally to metal since any metal approaching the coil of an oscillatory circuit causes this circuit to be damped. The possibilities of using these proximity switches are far more extensive than for magneto-sensitive proximity switches since they can be utilized to detect the position of any metallic object without this having to fulfill additional requirements.

In the case of inductive proximity switches of this type, it is conceivable to work with air-cored coils. In these cases, a time-dependent magnetic interference field, for example a welding field oscillating at 50 Hz, induces a voltage in the coil which beats against the voltage of the oscillator and results in a faulty indication in the proximity switch. Due to the inventive arrangement of two coils spaced from one another the same voltages are, however, induced in both coils. These voltages are subsequently eliminated due to the generation of a differential signal and so the time-dependent magnetic interference field has no influence.

In general, the coils used as sensors in proximity switches of this type are provided with ferrite cores. As soon as the sensors are located in an external magnetic interference field, the magnetic interference field leads to a saturation of these ferrite cores. This results in damping of the associated oscillator in exactly the same way as the approach of a machine element towards a sensor of this type. Even though, in the long run, the oscillator of each oscillatory circuit is damped both by the approach of a metallic machine element towards the sensor and by an external magnetic interference field, these two effects are based on entirely different mechanisms. The approach of a machine element influences the field generated by the ferrite core of the coil whereas the ferrite core is premagnetized by an external magnetic field and is therefore closer to its saturation state. Consequently, it is substantially less effective as a field concentrator for the coil. The generation of differential signals in such a design for the proximity switch has the result that the damping of both oscillators by the magnetic interference field cannot generate any output signals but is eliminated.

To increase sensitivity, above all of the coil lying closest to the machine element, it is advantageous for the coils to be provided with cup cores. In this way, the magnetic field of this coil essentially extends only on one side of the coil. The machine element then enters this field and causes the oscillator associated with this coil to be damped.

As the oscillators affect each other due to the coils arranged in the proximity switch in spaced relation to one another, i.e. by the superposition of the magnetic fields emanating from these coils, it is favourable for a shielding means to be provided between the coils to prevent this. In this way, no disturbing surges or similar interactions between the oscillators can occur which would lead to faulty output signals in the proximity switch.

In addition, it is expedient for the coils to be of identical design. In this case, it is also advantageous for the coils to be arranged coaxially to one another. This arrangement reduces superposition of the magnetic fields emanating from the coils and, thereby, any effect the oscillators may have on one another.

In all the embodiments described for the inventive inductive proximity switch no details have been specified as to the way, in which the differential signals are generated from the varying electrical output characteristics of the sensors. The proximity switches known from the state of the art have an oscillator which is damped by the approach of a machine element towards its coil and a signal is processed by measuring the change in the voltage amplitude of this oscillator. A direct generation of a differential signal from the voltage amplitudes measured at the two oscillators of the inventive proximity switch is, however, difficult and costly as, in this case, the frequencies of the two resonators must be exactly the same to avoid surges and similar defects. For this reason, it is advantageous, in a particularly preferred embodiment of the inventive proximity switch, for a rectifier circuit to be provided which rectifies voltages tapped at the oscillator, forms a mean value and transmits this mean value to the differential circuit.

Additional features and advantages of the invention result from the following description and the attached drawings of several embodiments of the invention, in which FIG. 1 is a broken-open illustration of a magnetosensitive proximity switch in a magnetic interference field of a cable and also shows a machine element to be detected;

Figure 1:
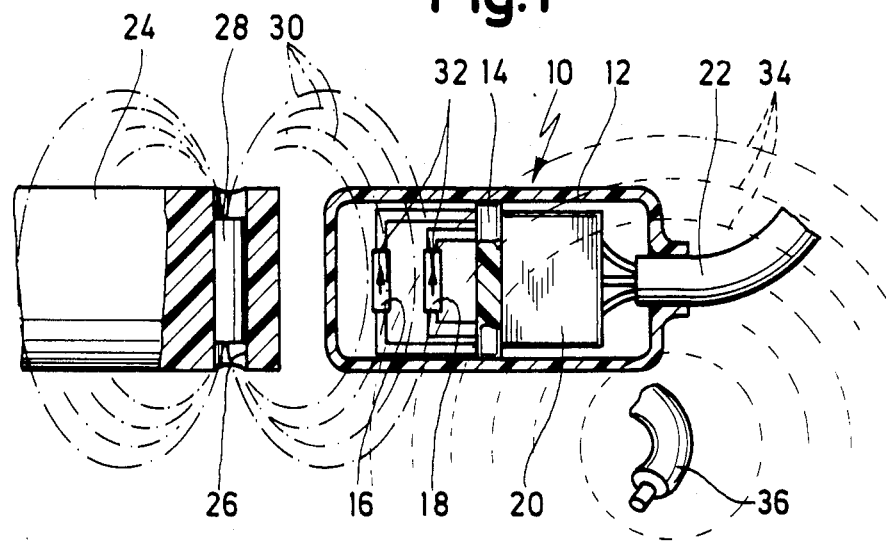

FIG. 1 shows in detail a housing 12 of a magneto-sensitive proximity switch which is designated as a whole as 10. A carrier plate 14 is provided in the interior of this housing 12 and two identical magnetic field sensors 16 and 18 are held on one side of this plate. These sensors are spaced from one another in the direction of a surface normal located on this side of the carrier plate 14. An electrical circuit designated as a whole as 20 adjoins the side of the carrier plate 14 remote from the magnetic field sensors 16 and 18. This electrical circuit is connected with the two magnetic field sensors 16 and 18 and comprises a differential circuit as well as a circuit for generating output signals which is known per se for these types of proximity switch. A feed cable 22 serves to supply voltage to the circuit 20 and to transmit output signals. This cable connects the proximity switch 10 with, for example, a control means.

A machine element 24 to be detected by the proximity switch 10 is provided with a bore 26 in which a bar magnet 28 is held. This magnet generates a magnetic field 30.

Each of the magnetic field sensors has a preferred direction 32 of sensitivity to magnetic fields which is dependent on the type of sensor used. The magnetic field sensors 16, 18 are arranged relative to one another such that the preferred directions 32 of sensitivity are parallel to one another and the magnetic field sensors have a common central plane extending at right angles to their respective preferred directions 32 of sensitivity. Their arrangement relative to the carrier plate 14 is advantageously selected such that the preferred directions 32 of sensitivity extend parallel to the plate 14.

The proximity switch 10 is to be arranged relative to the lines of flux of the magnetic field 30 such that these lines run parallel to the preferred directions 32 of sensitivity of the magnetic field sensors 16 and 18 and also penetrate the magnetic field sensors 16 and 18. It is, of course, a requirement for faultless functioning of the proximity switch that the housing 12 can be penetrated by the magnetic field 30 at least in an area surrounding the magnetic field sensors 16 and 18.

A magnetic interference field 34 results from a cable 36 located in the vicinity of the proximity switch 10. As illustrated, for example, in FIG. 1, this cable runs below the proximity switch 10. The interference field 34 also penetrates the magnetic field sensors 16 and 18 and so these sensors are subjected to the effect of both the magnetic field 30 and the interference field 34.

Figure 2:
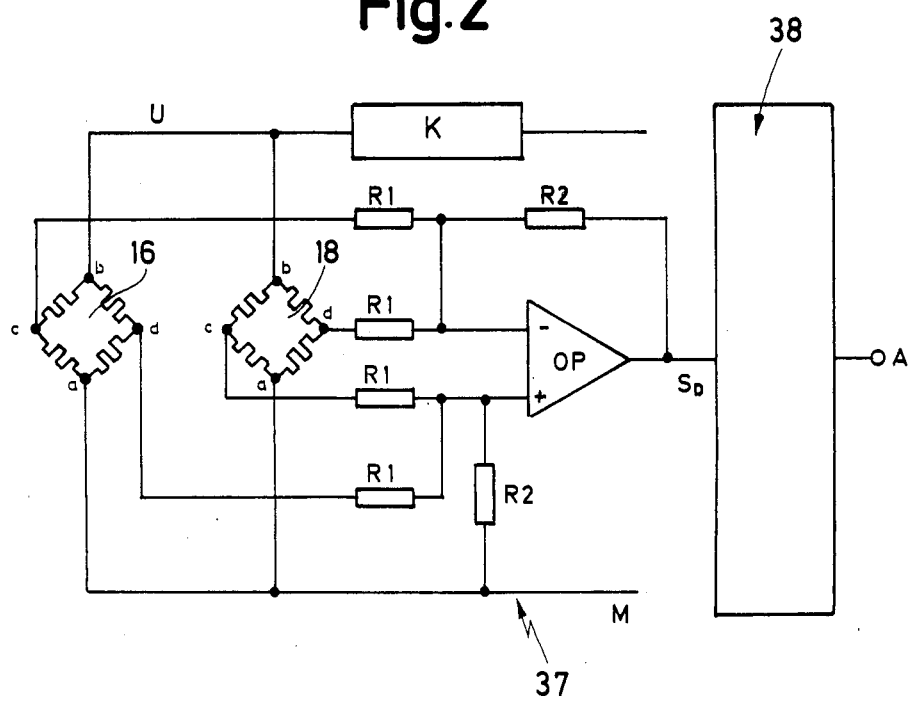
FIG. 2 is a circuit diagram of the proximity switch in FIG. 1.

The circuit diagram of FIG. 2 shows the two magnetic field sensors 16 and 18, each of which comprises four resistors made of Permalloy and interconnected to form a Wheatstone bridge. These resistors are generally deposited by evaporation, as meander-shaped layers, onto a common carrier substrate, for example a silicon chip. The sensors used are Permalloy sensors, which are customarily found in trade and may be obtained, for example, from the Valvo, Sony or Siemens companies. Each of the sensors has four connections a, b, c, d, the connections a and b, c and d hereby corresponding to opposite taps of the Wheatstone bridge.

The voltage U supplied from a constant voltage regulator K is applied to connections b of the respective magnetic field sensors 16 and 18, while connections a of these magnetic field sensors 16, 18 are connected to earth M. The opposite central taps c and d of the Wheatstone bridge circuit of each magnetic field sensor 16 and 18 are connected with the two inputs to an operational amplifier OP such that, for example, connection c of the magnetic field sensor 18 and connection d of the magnetic field sensor 16 are connected with a non-inverted input to the operational amplifier OP which is designated + and connection d of the magnetic field sensor 18 and connection c of the magnetic field sensor 16 are connected with an inverted input to the operational amplifier OP. Resistors R1 which are located between connections c and d of the respective magnetic field sensors 16 and 18 and the respective inputs to the operational amplifier OP serve to adjust the operating point in the customary way and to boost the operational amplifier OP, together with the resistors R2, one of which is located between the non-inverted input and earth and the other between the inverted input and the output of the operational amplifier OP. An output signal $S_D$ from the operational amplifier OP is passed through a circuit indicated only as block 38 and converted to an output signal A. The block 38 contains the components customary to known magnetic field switches, such as for example a low pass, a trigger stage for a positive field, a trigger stage for a negative field, a pulse holding stage when necessary and, finally, a power stage with operational indication which supplies the output signal A.

This connection in opposition of the magnetic field sensors 16 and 18 means that the operational amplifier OP operates not only as an amplifier but simultaneously as a differential circuit 37 and subtracts from one another the variations in resistance in the magnetic field sensors 16 and 18 which result on the basis of a magnetic field. For example, a magnetic field which raises the potential at connection d and lowers the potential at connection c does not lead to any variations in the potentials at the two inputs to the operational amplifier OP if the variations in potential are equal for both magnetic field sensors. The rise in potential at connection d of one magnetic field sensor is compensated by the drop in potential at connection c of the other magnetic field sensor. A variation in the potentials at the two inputs to the operational amplifier does not occur until the potentials at c and d of the two magnetic field sensors 16 and 18 are raised or lowered by varying degrees. The amplifier then supplies a differential signal $S_D$ which is converted by the circuit in block 38 into the output signal A.

Figure 3:
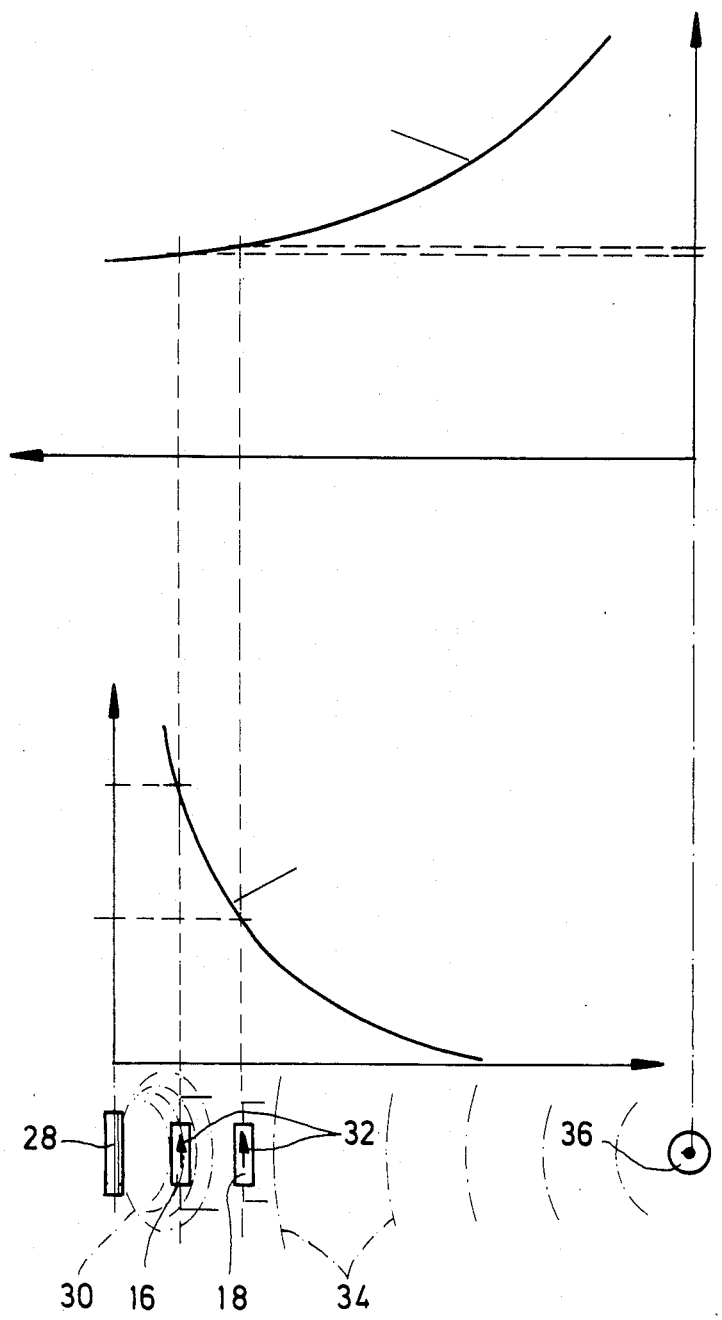
FIG. 3 is a schematic illustration of a spatial arrangement of magnet, sensors and cable as well as of a spatial decrease in magnetic field and interference field corresponding to this arrangement.

The mode of operation of the proximity switch illustrated in FIGS. 1 and 2 will now be explained on the basis of the schematic illustration in FIG. 3. The position of the bar magnet 28 relative to the magnetic field sensors 16 and 18 and to the cable 36 is sketched in. In the most distinct geometrical arrangement, the axis of the bar magnet 28 lies in the plane of drawing and parallel to the preferred directions 32 of sensitivity of the magnetic field sensors 16 and 18 which also lie in the plane of drawing. The cable 36, which is arranged on the side of the magnetic field sensors 16, 18 remote from the bar magnet 28 and is also spaced from these sensors, extends in a direction at right angles to the plane of drawing and in a central plane of the magnetic field sensors 16, 18 extending at right angles to their preferred directions 32 of sensitivity. As shown in FIG. 3 for this arrangement, the lines of flux of the bar magnet 28 and of the current-carrying cable 36 run parallel to one another at the location of the magnetic field sensors 16 and 18 and also parallel to their preferred directions 32 of sensitivity.

The upper diagram demonstrates the characteristic drop in the strength of the magnetic interference field 34 as a function of its radial distance from the current-carrying cable 36. As shown by the points of intersection of the two broken lines, each of which specifies the location of one of the magnetic field sensors 16 and 18 in spaced relation to the cable 36, with the curve designating the strength of the interference field 34, its strength at the location of the magnetic field sensor 18 is only slightly greater than at the location of the magnetic field sensor 16.

The lower diagram of FIG. 3 shows the strength of the magnetic field 30 in a direction at right angles to the axis of the bar magnet 28 and plotted against its distance from the bar magnet. The points of intersection of the curve showing the flux pattern with the dashed lines designating the locations of the magnetic field sensors 16 and 18 show that, in this case, a stronger field is present at the location of magnetic field sensor 16 than at the location of magnetic field sensor 18. The decisive factor is, however, the fact that the circuit of FIG. 2 with the magnetic fields sensors 16 and 18 does not measure any absolute values of the magnetic fields but immediately takes the difference between these two fields and so only the difference between the magnetic fields prevalent at the respective magnetic field sensors 16 and 18 is of importance. For this reason, the absolute value of the intensity of the interference field 34, which is of the same magnitude as the intensity of the magnetic field 30 in FIG. 3, is of no significance since the interference field 34 varies only slightly in intensity between the locations of the two magnetic field sensors 16 and 18. The interference field 34 is therefore a substantially constant field superposed over the magnetic field 30 at the locations of both sensors and is mostly eliminated due to the difference being taken.

In order to suppress the interference field as optimally as possible, the two magnetic field sensors 16 and 18 are arranged as close as possible to the position of the machine element 24 to be detected so that they are located in a region of the magnetic field 30 in which as large a gradient as possible is present in the direction of the distance between the two magnetic field sensors 16 and 18. This field gradient of the magnetic field 30 allows the two magnetic field sensors 16 and 18 to be arranged with the minimum of space between them but still results in an appreciable differential signal. The advantage is to be seen in the fact that the two magnetic field sensors are then normally located relatively far removed from the centre of the interference field and also in a region of the field strength curve, in which it has only a very slight gradient in the direction of the distance between the magnetic field sensors 16 and 18. In addition, the two magnetic field sensors 16 and 18 have only a slight distance between them. This means that the differences in the field strengths of the interference field 34 at the locations of the magnetic field sensors 16 and 18 are also very slight and, consequently, the differential signal caused by the interference field 34 is substantially smaller than the differential signal resulting from the magnetic field 30. This means, in general terms, that the two magnetic field sensors 16 and 18 are to be arranged in an area of the magnetic field 30, in which the prevailing gradient is as steep as possible. They can then lie very close to one another and still generate an adequate differential signal and, consequently, suppression of the magnetic interference field is at an optimum.

The arrangement of the two magnetic field sensors 16 and 18 illustrated in FIGS. 1 and 3 presupposes that the preferred directions 32 of sensitivity of the two sensors run parallel to one another. It is, however, quite conceivable, within the framework of the present invention, for the preferred direction 32 of sensitivity of the magnetic field sensor 16 to extend parallel to the magnetic field 30 prevailing at the location of the magnetic field sensor 16 and for the preferred direction 32 of sensitivity of the magnetic field sensor 18 to be inclined relative to the direction of the magnetic field 30 prevailing at its location. In this way, the magnetic field 30 generates a greater differential signal $S_D$ than when the magnetic field sensors 16 and 18 have their preferred directions of sensitivity aligned parallel to one another. This arrangement would be advantageous in certain cases for generating a greater differential signal $S_D$. It does, however, have the disadvantage that an orientation of the interference field 34 such that it runs parallel to the preferred direction 32 of sensitivity of the magnetic field sensor 18 at the location of this sensor and is, consequently, not parallel to the preferred direction 32 of sensitivity of magnetic field sensor 16 at the location of this sensor would also generate a greater differential signal $S_D$ and so, on the whole, suppression of the interference field could not be improved. For this reason, it is favourable for proximity switches which are produced in mass production and universally useable to have the preferred directions 32 of sensitivity of the two magnetic field sensors 16 and 18 running parallel to one another.

In addition, the Permalloy sensors of the embodiment illustrated in FIGS. 1 to 3 may be replaced by Hall sensors which, like the Permalloy sensors, are magneto-sensitive. Such Hall sensors are customarily found in trade and may be obtained, for example, from the Honeywell, Sprague and Siemens companies. The Hall sensors also have a preferred direction of sensitivity and so, in principle, their arrangement can be identical to that shown in FIGS. 1 and 3. In addition, the Hall sensors can be used in a Wheatstone bridge arrangement, as shown in the circuit diagram of FIG. 2. The constant voltage regulator K then provides for a constant current flowing through the Hall sensor and the respective Hall voltages tapped at the two Hall sensors, which are switched against one another with opposite polarity, as in the two Wheatstone bridges of FIG. 2, are to be connected with the inputs to the operational amplifier OP. It is then, of course, necessary to adapt the constant voltage U and the resistors R1 and R2 to the respective specifications of the Hall sensors and the operational amplifier OP used.

Figure 4:
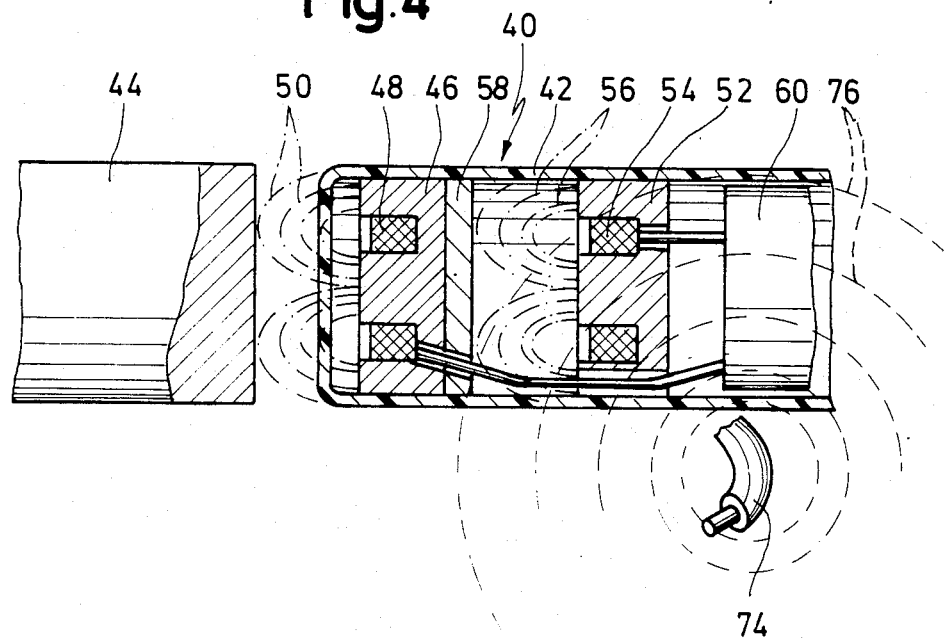
FIG. 4 is a broken-open illustration of an inductive proximity switch in the magnetic interference field of a cable and also shows a machine element to be detected.

The second embodiment of an inventive proximity switch is shown in FIG. 4. This is based on the principle of a known inductive proximity switch. The proximity switch designated as a whole as 40 has a housing 42, in which a cup core 46 with a coil 48 mounted therein is held in a region facing the machine element 44 to be detected. The cup core 46 is thereby aligned such that the side of the cup core 46, from which a magnetic field 50 generated by the coil 48 emanates, faces the machine element 44.

A second cup core 52, which bears a coil 54 and is identical to the first cup core 46, is arranged coaxially to the cup core 46, at a distance therefrom and on the side of the cup core 46 remote from the machine element 44. The cup core 52 is also arranged in the housing such that a magnetic field 56 emanating from this cup core points in the direction of the first cup core 46. A shielding means 58 is provided between these two cup cores to decouple the two cores 46 and 52 and the coils 48 and 54. The shielding means 58 abuts directly on the side of the cup core 46 facing the cupe core 52 and generally consists of a metal sheet having the same diameter as the cup core 46.

Figure 5:
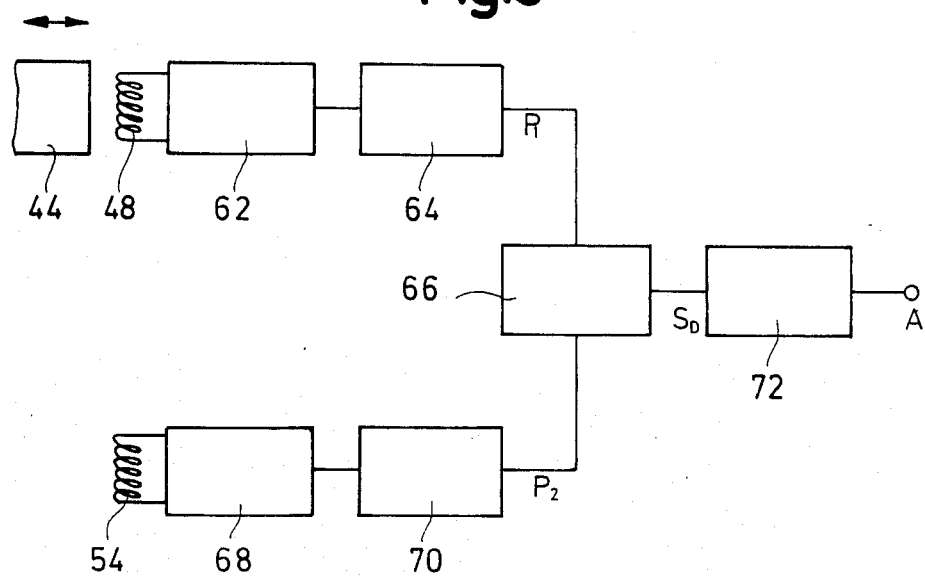
FIG. 5 is a block diagram of the proximity switch in FIG. 4.

An electrical circuit 60 is provided in the housing 42 on the side of the cup core 52 remote from the cup core 46. This circuit comprises, as shown by the block diagram in FIG. 5, an oscillator 62 having an oscillatory circuit, the coil of which represents the coil 48. The voltage amplitude values of the oscillator 62 are measured and rectified in a rectifier 64 which supplies a signal level $P_1$ for a differential circuit 66, this signal level being proportional to the maximum voltage amplitude values of the oscillator 62. In addition, the electrical circuit 60 comprises an oscillator 68 having an oscillatory circuit, the coil of which represents the coil 54. The voltage amplitude values of this oscillator are measured as well, rectified in a rectifier 70 and made available to the differential circuit 66 as signal level $P_2$. The differential circuit 66 now generates, from these signals, the differential signal $S_D$ and feeds this to a circuit 72 which may comprise an amplifier circuit, frequency filter, a trigger stage for a positive differential signal and a trigger stage for a negative differential signal, possibly a pulse holding member as well as a power output stage which then supplies the output signal A of the proximity switch.

As shown in FIG. 4, the proximity switch 40 is located in an interference field 76 which is generated by a current-carrying cable 74 extending, for example, below the proximity switch 40. This interference field penetrates the housing 42 at least in those areas which surround the cup cores 46 and 52.

The function of the proximity switch 40 will first be described without the influence of the interference field 76 and without the influence of the machine element 44. In this state, both oscillators 62 and 68 of the proximity switch 40 oscillate at their own respective frequencies and the maximum voltage amplitude of both oscillators is measured. These amplitudes are then converted by the rectifiers 64 and 70 into a constant signal level $P_1$ or $P_2$, respectively. These two signal levels $P_1$, $P_2$ may be selected such that they are either equal or have a freely determinable difference between them. The differential signal $S_D$ generated by the differential circuit 66 is either zero when the signal levels $P_1$, $P_2$ are the same or has a constant value corresponding to the predetermined difference between the two signal levels. This will, however, be received by the subsequent circuit 72 as the signal that the machine element 44 is not in its position to be detected and so the signal A corresponding to this position is present at the output from the circuit 72.

Figure 6:
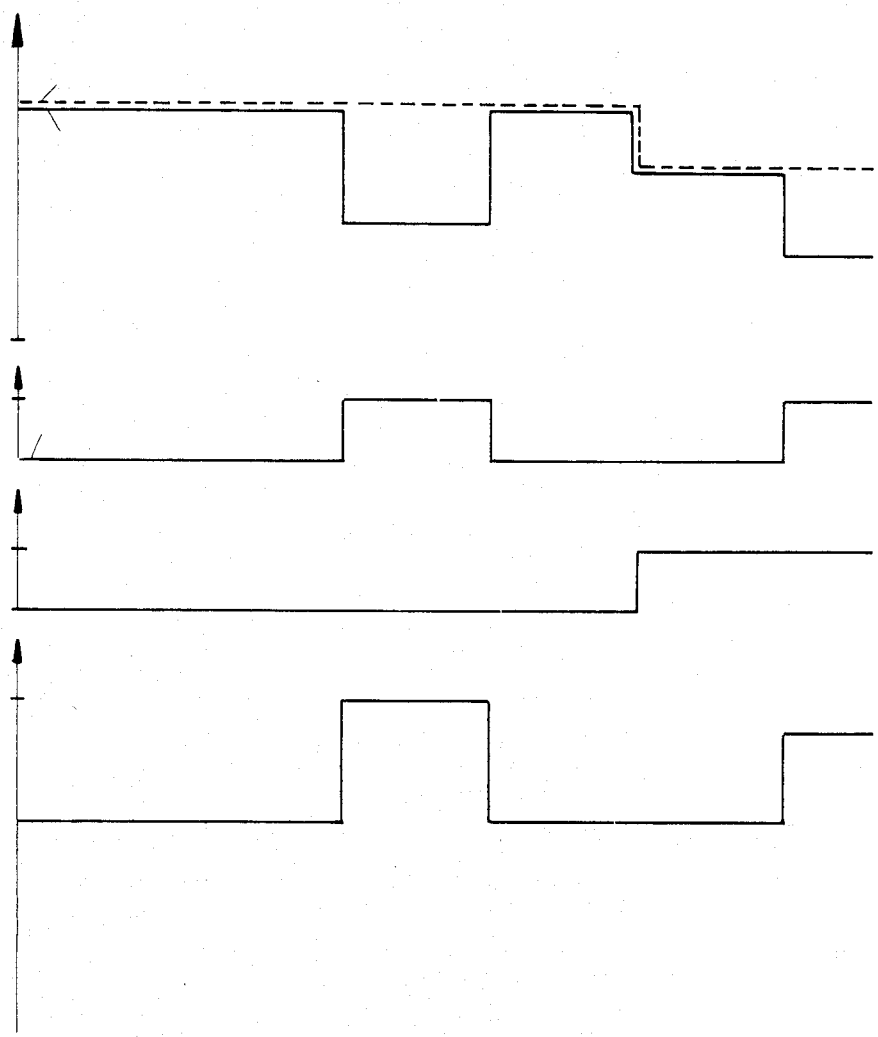
FIG. 6 is a schematic illustration of changes in a signal level of the oscillators and a differential signal at varying states of damping.

As soon as the machine element 44 has reached its position to be detected the magnetic field 50, emanating from the cup core 46 and generated by the coil 48, is disturbed and so damping of the oscillator 62, i.e. a reduction in voltage amplitude, occurs (FIG. 6). Consequently, the rectifier 64 generates a lower signal level $P_1$. The differential signal $S_D$ generated by the differential circuit 66 changes and the circuit 72 generates an output signal A which corresponds to the position of the machine element 44 to be detected.

As already described at the outset, the interference field 76 has the effect that the two cup cores 46 and 52 are premagnetized and therefore in a state close to saturation. Both oscillators 62 and 68 are thereby damped since the effect of the ferrite in the cup cores 46 and 52 is substantially less due to premagnetization. FIG. 6 shows this damping of the two oscillators 62 and 68. The machine element 44 is hereby not in its position to be detected and therefore has no influence. This damping also causes the voltage amplitudes of the two oscillators 62 and 68 to be reduced and so, consequently, the two signal levels $P_1$ and $P_2$ generated by the rectifiers 64 and 70 also drop. The differential signal $S_D$ generated by the differential circuit 66 is not, however, altered since the two signal levels $P_1$, $P_2$ drop to the same extent.

An alteration in the differential signal $S_D$ is not generated until the machine element 44 is in its position to be detected. The absolute value of the differential signal $S_D$ is then smaller, due to premagnetization of the cup cores 46, 52, than in the case where no interference field is present (FIG. 6).

In the case of interference fields 76, which have a gradient in the direction of the distance between coils 48 and 54, this distance between the coils 48 and 54 is preferably chosen as small as possible so that the differential signal $S_D$ generated by the interference field is also as small as possible and, consequently, negligible in relation to the differential signal $S_D$ generated by the machine element.

Insofar as the oscillators 62 and 68 are not completely damped by the interference field 76 and insofar as the machine element 44 also does not damp the oscillator 62 to any great degree, the magnetic field sensor operates efficiently in the case of interference fields which are both constant in time and variable in time.

If, however, the interference field 76 leads to an almost complete damping of the two oscillators 62 and 68 and the machine element 44 in its position to be detected also leads to an almost complete damping of the oscillator 62, the proximity swtich 40 no longer functions, at least not in the case of interference fields 76 which are constant in time, since the oscillator 62 which is almost completely damped by the interference field 76 no longer registers the additional damping caused by the machine element 44. In the reverse case, when the oscillator 62 is almost completely damped by the machine element 44 in its position to be detected, an interference field 76 which also damps the oscillator 62 and the oscillator 68 almost completely will result in the differential signal $S_D$ reverting to its original value and no longer having the value which it should normally show for the machine element 44 in its position to be detected. These difficulties do not, however, occur during normal use since the interference fields are usually dependent on time. For example, during welding it is mainly alternating current which is used and so the interference fields have the same dependency on time as the alternating current. The two oscillators 62 and 68 are damped with the same frequency as the interference field and so an undamped state constantly alternates with a damped state. This can be utilized to measure the difference only in the state free of an interference field, with the aid of corresponding electrical circuits, or to eliminate, for one measurement, the state very strongly damped for a short time by the interference field, with the aid of corresponding pulse holding members.

A further advantageous characteristic of the inventive inductive proximity switch is to be seen in the fact that the known oscillators are all subject to very strong temperature drifts. The signal level $P_1$ indiciting that a machine element 44 has reached its position to be detected is subject to very large fluctuations. For this reason, the machine element 44 could be indicated as having reached its position to be detected only if the respective oscillator were damped to an extent greater than the fluctuations caused by temperature drifts. This damping of the respective oscillator, which was strong of necessity, required a smaller switching distance, i.e. a smaller space between the machine element to be detected and the coil in order to generate a switching signal. It is, however, possible to compensate for temperature fluctuations to a considerable degree using the second oscillator 68 as reference and subsequently generating a differential signal. In this respect, the inventive proximity switch is not only unaffected by interference fields but also facilitates a substantially greater switching distance since the temperature-dependent fluctuations of the voltage amplitude of the oscillator 62 can be compensated by comparison with the temperature-dependent fluctuations of the voltage amplitude of oscillator 68. Consequently, a substantially reduced damping of the oscillator 62 by the machine element 44 is sufficient to generate the switching signal reliably, i.e. the signal indicating that the machine element 44 is in its position to be detected. Therefore, the distance between the machine element 44 and the coil 48 or the cup core 46 which is required for generating the switching signal can be substantially greater.

What is claimed is:

1. A proximity switch for detecting position of a machine element provided with a magnet, comprising:
    at least two sensors which respond to an approach of said machine element by varying electrical output characteristics of said sensors, said sensors comprising magnetic field sensors which are affected by magnetic fields, and said sensors being arranged in spaced relation to one another in such a way that one of said sensors is at a smaller distance from said machine element than the other sensor when said machine element is in a position to be detected,
    a differential circuit to which said sensors are connected for generating a differential signal from said electrical output characteristics of the sensors to compensate for signals generated by interference fields, said sensors being so arranged relative to the machine element and having such a distance between said sensors and said machine element that the differential signal caused by the machine element when the machine element is in said position to be detected is greater than the differential signal generated due to said interference fields, and
    a circuit associated with said sensors for converting said differential signal into an output signal for the proximity switch.

2. Proximity switch as defined in claim 1, wherein said sensors are so arranged relative to the machine element and have such a distance between said sensors and said machine element that the differential signal caused by the machine element in said position to be detected exceeds the differential signal generated due to the interference fields at least approximately by a factor of 10.

3. Proximity switch as defined in claim 1, wherein said magnetic field sensors each have a preferred direction of sensitivity to magnetic fields and are aligned such that their preferred directions of sensitivity extend parallel to a magnetic field to be detected.

4. Proximity switch as defined in claim 1, wherein said magnetic field sensors are comprised of a material which alters its electrical resistance in response to an external magnetic field.

5. Proximity switch as defined in claim 1, wherein said sensors are Hall sensors.

6. A proximity switch for detecting position of a machine element, comprising:
    at least two sensors being coils of oscillatory circuits of oscillators dampable by an approach of said machine element and varying electrical output characteristics of said sensors accordingly, said sensors being affected by interference fields, and being arranged in spaced relation to one another in such a way that one of said sensors is at a smaller distance from the machine element than the other sensor when said machine element is in a position to be detected, and being connected for generating differential signals from said electrical output characteristics of the sensors to compensate for signals generated by said interference fields, and
    a circuit associated with said sensors for converting the differential signals into output signals for the proximity switch having a rectifier circuit associated with each of said oscillators, each rectifier circuit rectifying voltages tapped at the oscillator and forming a mean value and transmitting said mean value to a differential circuit for generation of said differential signals, said sensors being so arranged relative to said machine element and having such a distance between said sensors and said machine element that the differential signal caused by said machine element in said position to be detected is greater than the differential signal generated due to the interference fields.

7. Proximity switch as defined in claim 6, wherein said coils are provided with cup cores.

8. Proximity switch as defined in claim 6, wherein a shielding means is provided between the coils.

9. Proximity switch as defined in claim 6, wherein said coils are of identical design.

10. Proximity switch as defined in claim 6, wherein said coils are arranged coaxially to one another.

11. Proximity switch as defined in claim 6, wherein said sensors are so arranged relative to the machine element and have such a distance between said sensors and said machine element that the differential signal caused by the machine element in said position to be detected exceeds the differential signal generated due to the interference fields at least approximately by a factor of 10.

* * * * *